United States Patent
Wu et al.

(10) Patent No.: US 11,606,091 B2
(45) Date of Patent: Mar. 14, 2023

(54) INPUT/OUTPUT MODULE

(71) Applicant: FARADAY TECHNOLOGY CORPORATION, Hsinchu (TW)

(72) Inventors: Chih-Hung Wu, Hsinchu (TW); Yu-Chieh Ma, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/399,312

(22) Filed: Aug. 11, 2021

(65) Prior Publication Data

US 2022/0182055 A1    Jun. 9, 2022

(30) Foreign Application Priority Data

Dec. 7, 2020 (TW) ................................. 109143044

(51) Int. Cl.
*H03K 19/003* (2006.01)
(52) U.S. Cl.
CPC .............................. *H03K 19/00361* (2013.01)
(58) Field of Classification Search
None
See application file for complete search history.

(56) References Cited

U.S. PATENT DOCUMENTS

2014/0103966 A1*  4/2014  Wang ............... H03K 19/00315
                                                        327/108
2017/0359073 A1   12/2017  Azizi et al.
2018/0109255 A1*  4/2018  Lee ................. H03K 19/00315
2022/0053690 A1*  2/2022  Egan ..................... A01D 57/20

FOREIGN PATENT DOCUMENTS

TW          202001887 A       1/2020

OTHER PUBLICATIONS

Office Action issued by TIPO dated Feb. 9, 2021, Taiwan.
Chen et al. "An Output Buffer for 3.3-V Applications in a 0.13-μm 1/2.5-V CMOS Process", IEEE Transactions on Circuits and Systems II: Express Briefs (vol. 54, Issue: 1, Jan. 2007).

* cited by examiner

*Primary Examiner* — Jany Richardson
(74) *Attorney, Agent, or Firm* — WPAT, PC

(57) ABSTRACT

An input/output module electrically coupled between a control circuit and an input/output pin is provided. The input/output module includes a pre-driver and a post-driver. The pre-driver is electrically coupled to the control circuit, and the post-driver is electrically coupled between the pre-driver and the input/output pin. The pre-driver generates a pull-up selection signal and a pull-down selection signal according to an input signal and an enable signal generated by the control circuit. The post-driver sets a voltage level of the input/output pin according to the pull-up and pull-down selection signals. When the enable signal is at a first logic level, the input/output pin has a high impedance. When the enable signal is at a second logic level, the voltage level of the input/output pin changes with a logic level of the input signal, wherein the first logic level and the second logic level are inverted.

13 Claims, 6 Drawing Sheets

US 11,606,091 B2

INPUT/OUTPUT MODULE

This application claims the benefit of Taiwan application Serial No. 109143044, filed Dec. 7, 2020, the subject matter of which is incorporated herein by reference.

BACKGROUND OF THE INVENTION

Field of the Invention

The disclosure relates in general to an input/output module, and more particularly to an input/output module controlled under logic signals.

Description of the Related Art

Please refer to FIG. 1, which is a schematic diagram illustrating a conventional input/output module. To control the voltage of the input/output pin (IO) 15 by pull-up or pull-down, the conventional input/output module 10 uses a voltage supply circuit 11. In FIG. 1, the voltage supply circuit 11 provides control voltages Vctl1, Vctl2, and Vctl3 to the gate terminals of the transistors M1, M2, and M3, respectively. The control voltage Vctl1 may have a voltage range of 2.5V~4.5V, the control voltage Vctl2 may have a voltage range of 0V~4.5V, and the control voltage Vctl3 may have a value of 2.5V.

When the input signal IN is at a high logic level (IN=1), the voltage supply circuit 11 sets the control voltages Vctl1 and Vctl2 to 2.5V and 0V, respectively. Therefore, the transistor M2 is switched off within the safe operating voltage range. On the other hand, the control voltage Vctl3 makes the transistor M3 switched on, and the input signal IN at the high logic level makes the transistor M4 switched on. The transistors M3 and M4 in the ON state conduct the ground voltage Gnd to the input/output pin (IO) 15 so that the voltage of the input/output pin (IO) 15 is equivalent to the ground voltage Gnd (IO=Gnd).

On the contrary, when the input signal IN is at a low logic level (IN=0), the voltage supply circuit 11 sets the control voltages Vctl1 and Vctl2 to 4.5V to make the transistors M1 and M2 switched on. On the other hand, the control voltage Vctl3 also makes the transistor M3 switched on, and the input signal IN at the low logic level makes the transistor M4 switched off. The operating voltage of the transistor M4 is in the safe range because the control voltage Vctl3 is controlled at 2.5V. The transistors M1 and M2 in the ON state conduct the supply voltage Vdd to the input/output pin (IO) 15 so that the voltage of the input/output pin (IO) 15 is equivalent to the supply voltage Vdd (IO=Vdd).

To respectively control the control voltages Vctl1, Vctl2, and Vctl3, the voltage supply circuit 11 needs to provide multiple combinations of the control voltages in response to the input signal IN. In some applications, the input/output module 10 needs to set the duty cycle of the input/output pin (IO) 15 which further increases the complexity of the voltage supply circuit 11. For example, the transistors M1 and M2 are switched on and the transistor M4 is switched off during 50% of periods, while the transistors M1 and M2 are switched off and the transistor M4 is switched on during other 50% of periods.

Such switching operation requires complicated control operation of the voltage supply circuit 11. The frequent switching among different voltages also causes interference at the input/output pin (IO) 15.

SUMMARY OF THE INVENTION

The disclosure is directed to an input/output module, and more particularly to an input/output module with voltages controlled under logic signals.

According to the present disclosure, an input/output module electrically coupled between a control circuit and an input/output pin is provided. The input/output module includes a pre-driver and a post-driver. The pre-driver is electrically coupled to the control circuit and generates a pull-up selection signal and a pull-down selection signal according to logic levels of an input signal and an enable signal generated by the control circuit. The post-driver is electrically coupled between the pre-driver and the input/output pin and sets a voltage level of the input/output pin according to the pull-up selection signal and the pull-down selection signal. When the enable signal is at a first logic level, the post-driver sets the input/output pin to be in a high-impedance state. When the enable signal is at a second logic level, the post-driver changes the voltage level of the input/output pin according to the logic level of the input signal, wherein the first logic level and the second logic level are inverted.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 2:
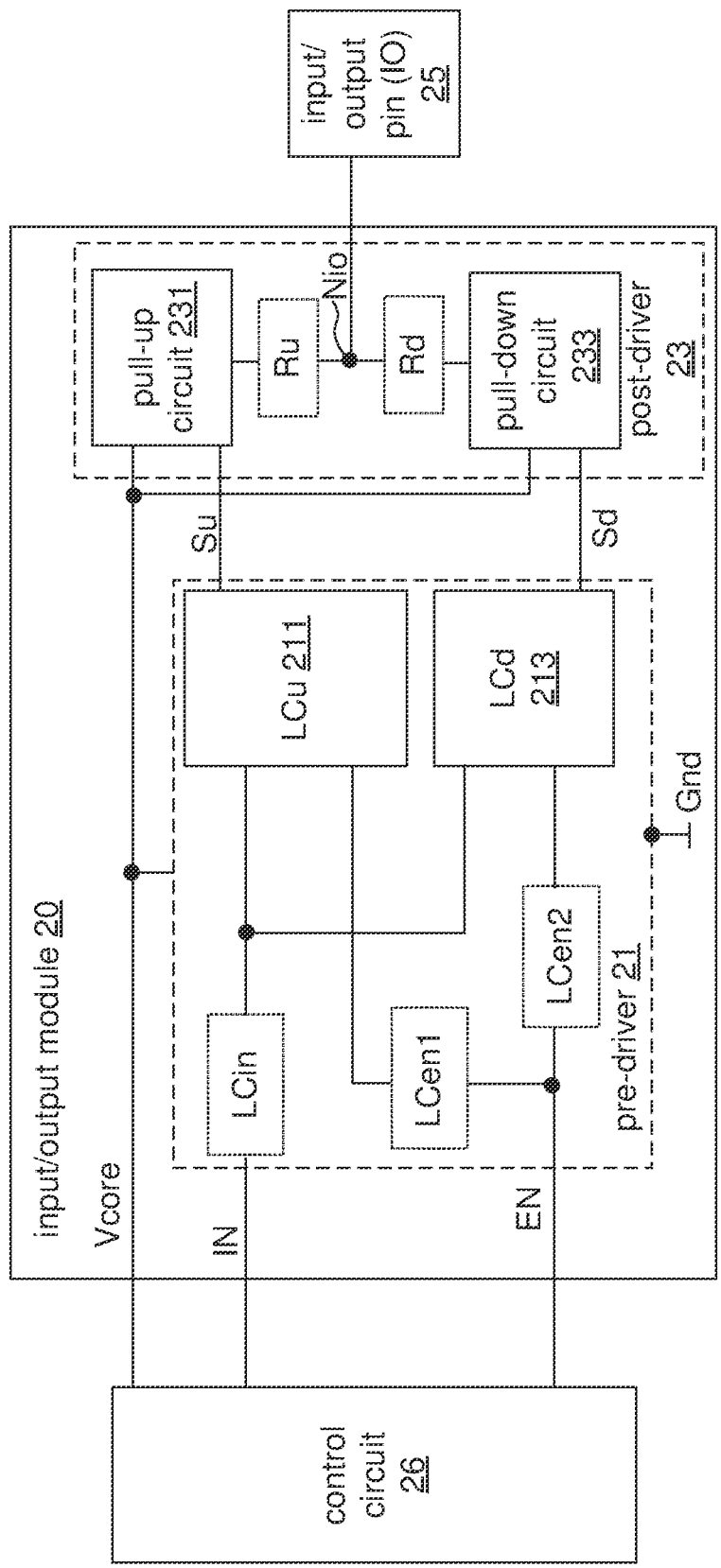
FIG. 2 is a block diagram illustrating an input/output module of the present disclosure.

Please refer to FIG. 2, which is a block diagram illustrating an input/output module of the present disclosure. The input/output module 20 is electrically coupled between the control circuit 26 and the input/output pin (IO) 25. The input/output pin (IO) 25 is electrically coupled to the input/output module 20 through the input/output node Nio. The input/output module 20 includes a pre-driver 21 and a post-driver 23. The control circuit 26 provides a core voltage Vcore, an input signal IN and an enable signal EN. The supply voltage Vdd (e.g. 1.05V) is higher than the core voltage Vcore (e.g. 0.8V).

The pre-driver 21 is electrically coupled to the control circuit 26. The pre-driver 21 receives the core voltage Vcore, the input signal IN, and the enable signal EN from the control circuit 26. The internal circuits in the pre-driver 21 operate based on the core voltage Vcore. The pre-driver 21 generates a pull-up selection signal Su and a pull-down selection signal Sd according to the input signal IN and the enable signal EN. When the pull-up selection signal Su or the pull-down selection signal Sd is at the high logic level (Su=1 or Sd=1), the voltage of which is equivalent to the core voltage Vcore. On the other hand, when the pull-up selection signal Su or the pull-down selection signal Sd is at the low logic level (Su=0 or Sd=0), the voltage of which is equivalent to the ground voltage Gnd.

The pre-driver 21 includes a pull-up setting circuit (LCu) 211 and a pull-down setting circuit (LCd) 213. The pull-up setting circuit (LCu) 211 generates the pull-up selection signal Su in response to the input signal IN and the enable signal EN, while the pull-down setting circuit (LCd) 213 generates the pull-down selection signal Sd in response to the input signal IN and the enable signal EN. In an embodiment, the pre-driver 21 further includes an enable circuit LCen1 or LCen2. The presence or absence of the enable circuit LCen1 and/or LCen2 is adjustable in different applications. The enable circuit LCen1 and/or LCen2 is electrically coupled to the control circuit 26, and receives the enable signal EN from the control circuit 26 to generate an inverted enable signal ENb.

Figure 3A:
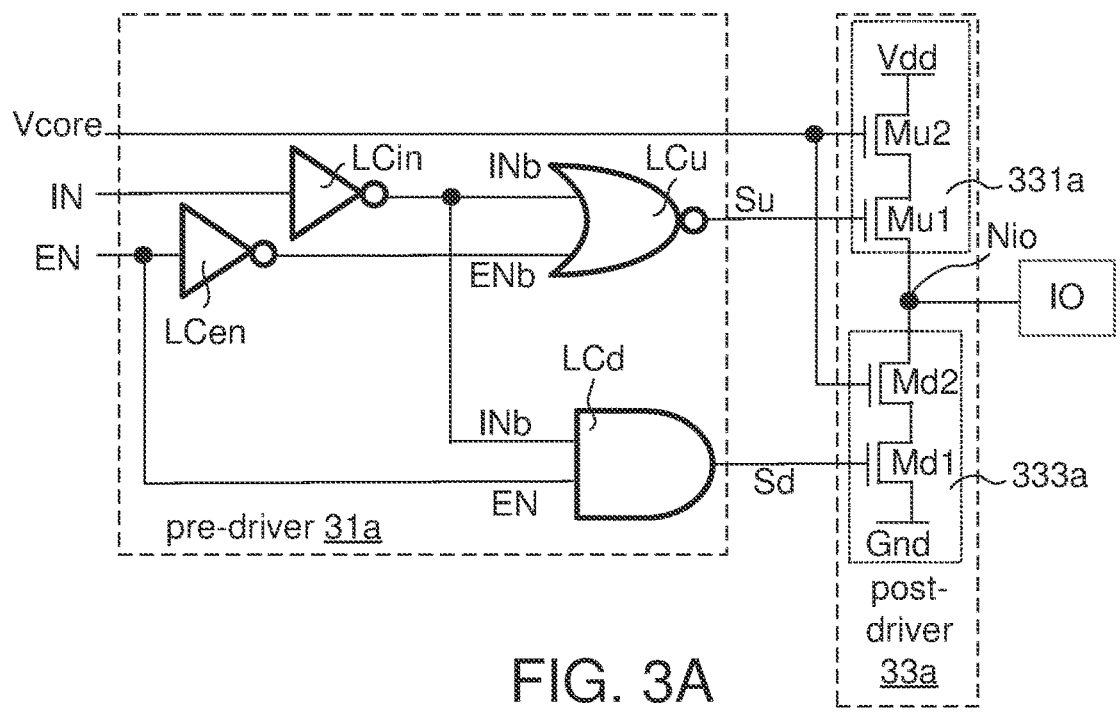
FIG. 3A is a circuit diagram illustrating an input/output module according to an embodiment of the present disclosure.
Figure 3B:
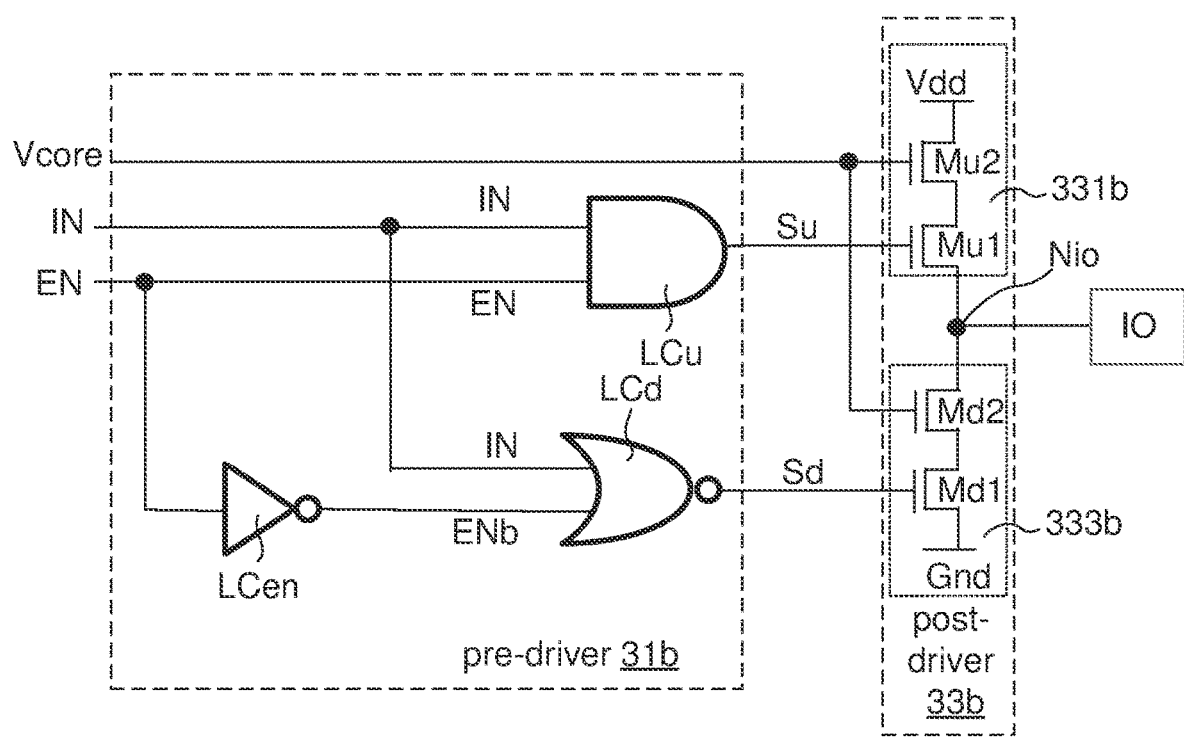
FIG. 3B is a circuit diagram illustrating an input/output module according to another embodiment of the present disclosure.
Figure 5A:
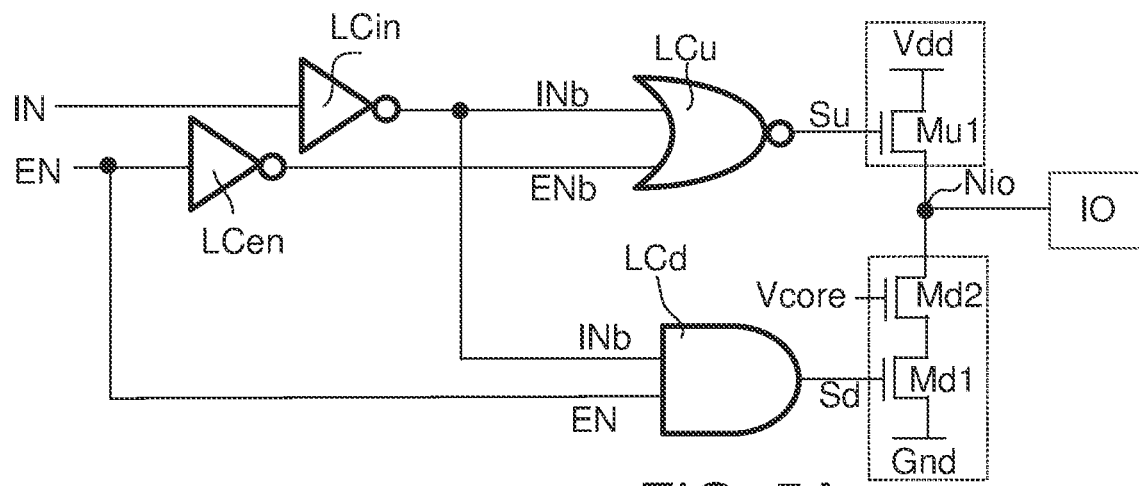
FIGS. 5A and 5B are circuit diagrams illustrating input/output modules using a modified pull-up circuit according to the present disclosure.
Figure 5B:
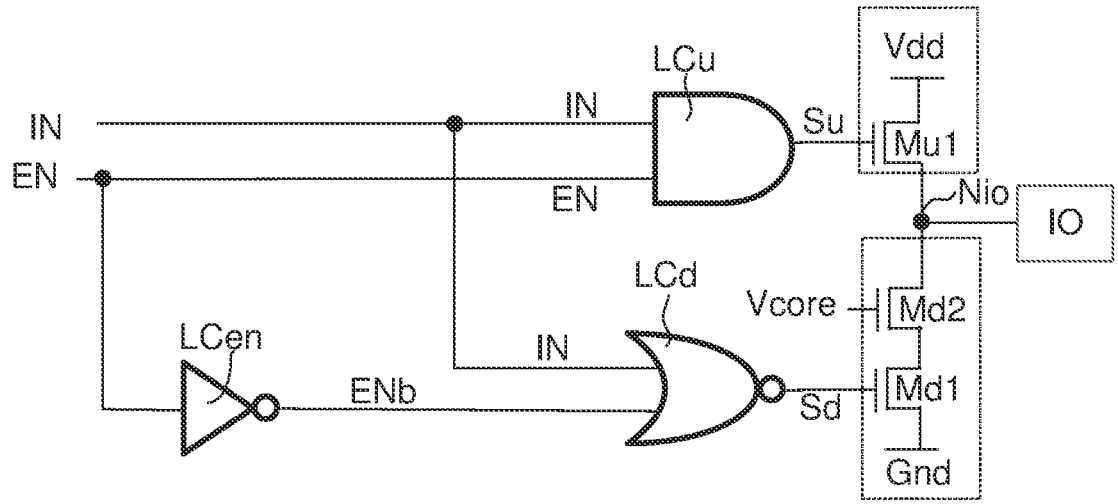
Figure 6A:
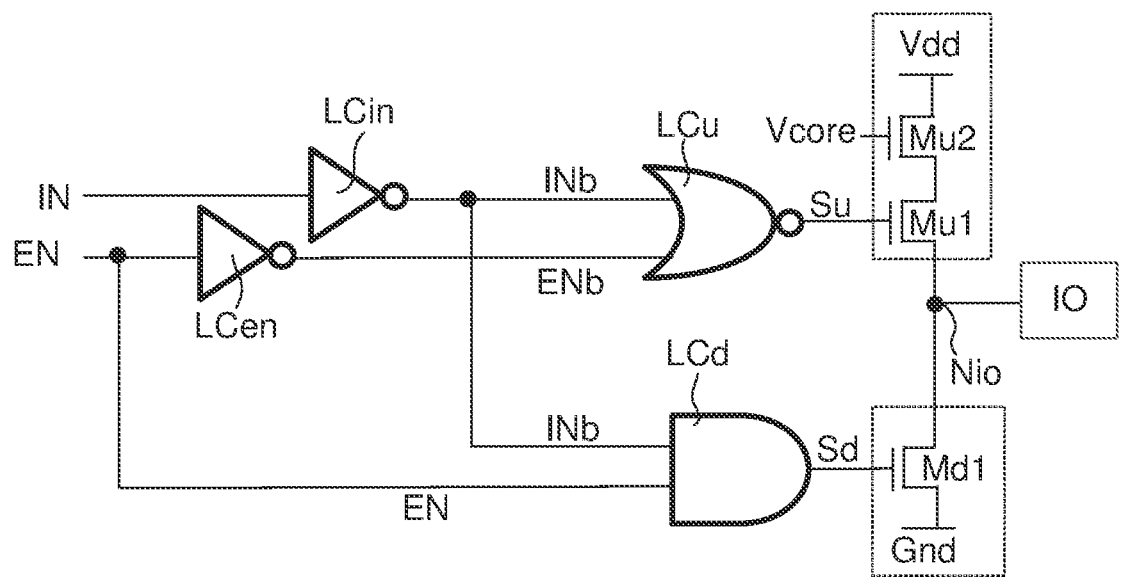
FIGS. 6A and 6B are circuit diagrams illustrating input/output modules using another modified pull-down circuit according to the present disclosure.
Figure 6B:
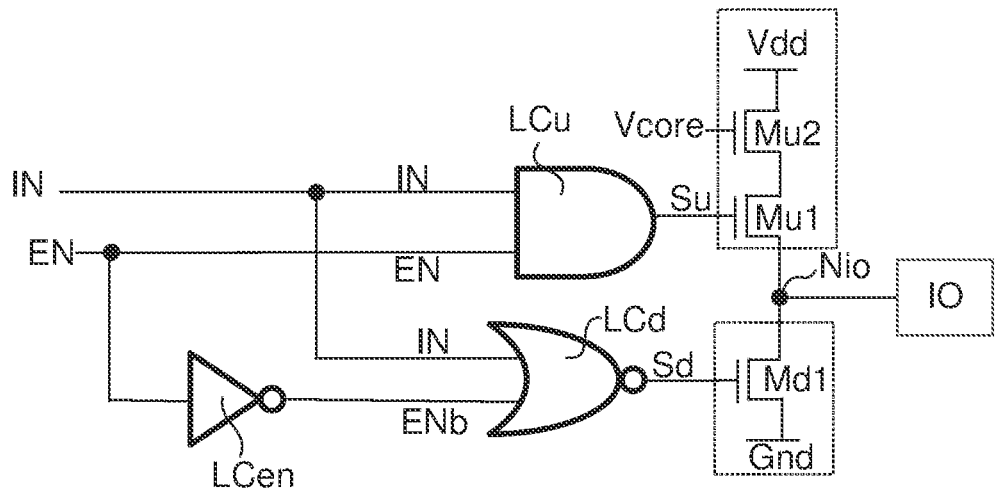

According to the concepts of the present disclosure, when the pull-up setting circuit (LCu) 211 receives the enable signal EN, the pull-down setting circuit (LCd) 213 receives the inverted enable signal ENb through the enable circuit LCen2. On the contrary, when the pull-up setting circuit (LCu) 211 receives the inverted enable signal ENb through the enable circuit LCen1, the pull-down setting circuit (LCd) 213 receivers the enable signal EN. In the embodiment of FIG. 3A, 5A, or 6A, the pull-up setting circuit LCu is considered to receive the inverted enable signal ENb from the enable circuit LCen1, and the pull-down setting circuit LCd receives the enable signal EN. In the embodiment of FIG. 3B, 5B, or 6B, the pull-up setting circuit LCu receives the enable signal, and the pull-down setting circuit LCd is considered to receive the inverted enable signal ENb from the enable circuit LCen2.

The post-driver 23 is electrically coupled between the pre-driver 21 and the input/output pin (IO) 25. The post-driver 23 receives the pull-up selection signal Su and the pull-down selection signal Sd from the pre-driver 21 to set the voltage level of the input/output pin (IO) 25. The post-driver 23 includes a pull-up circuit 231 and a pull-down circuit 233, both of which are electrically coupled to the pre-driver 21. The pull-up circuit 231 is directly electrically connected to the pull-up setting circuit (LCu) 211, from which the pull-up circuit 231 receives the pull-up selection signal Su. The pull-down circuit 233 is directly electrically connected to the pull-down setting circuit (LCd) 213, from which the pull-down circuit 233 receives the pull-down selection signal Sd. The pull-up circuit 231 selectively conducts the supply voltage Vdd to the input/output node Nio in response to the pull-up selection signal Su generated by the pull-up setting circuit (LCu) 211. The pull-down circuit 233 selectively conducts the ground voltage Gnd to the input/output pin (IO) 25 in response to the pull-down selection signal Sd generated by the pull-down setting circuit (LCd) 213. The pull-up circuit 231 and the pull-down circuit 233 do not form conducting paths simultaneously.

As shown in FIG. 2, the post-driver 23 further includes a pull-up resistor Ru and a pull-down resistor Rd to enhance the linearity of the input/output signal. The pull-up resistor Ru and the pull-down resistor Rd could be of identical resistance value (e.g. 120 ohms) or different resistance values (e.g. one is 120 ohm and the other one is 80 ohm). The pull-up resistor Ru is electrically coupled between the pull-up circuit 231 and the input/output node Nio, and the pull-down resistor Rd is electrically coupled between the pull-down circuit 233 and the input/output node Nio. Although the pull-up resistor Ru and the pull-down resistor Rd are not shown in some simplified drawings, the pull-up resistor Ru and/or the pull-down resistor Rd could be introduced to meet respective requirements.

Please refer to FIG. 3A, which is a circuit diagram illustrating an input/output module according to an embodiment of the present disclosure. The components and internal connection of the pre-driver 31*a* and the post-driver 33*a* are described below.

In the pre-driver 31*a*, the input circuit LCin is an inverter, the enable circuit LCen is an inverter, the pull-up setting circuit LCu is a NOR gate, and the pull-down setting circuit LCd is an AND gate. At first, the input circuit LCin inverts the input signal IN to generate an inverted input signal INb, and the enable circuit LCen inverts the enable signal EN to generate an inverted enable signal ENb. In FIG. 3A, after receiving the enable signal EN and generating the inverted enable signal ENb, the enable circuit LCen transmits the inverted enable signal ENb to the pull-up setting circuit LCu. Therefore, the enable circuit LCen in FIG. 3A is equivalent to the enable circuit LCen1 in FIG. 2. After receiving the inverted input signal INb and the inverted enable signal ENb, the NOR gate serving as the pull-up setting circuit LCu generates the pull-up selection signal Su. Also, after receiving the inverted input signal INb and the enable signal EN, the AND gate serving as the pull-down setting circuit LCd generates the pull-down selection signal Sd.

In the post-driver 33*a* as shown in FIG. 3A, the pull-up circuit 331*a* includes pull-up transistors Mu1 and Mu2, while the pull-down circuit 333*a* includes pull-down transistors Md1 and Md2. All of the pull-up transistors Mu1 and Mu2 and the pull-down transistors Md1 and Md2 are NMOS transistors.

In the pull-up transistor Mu2, the drain terminal is electrically coupled to the supply voltage Vdd, the gate terminal receives the core voltage Vcore, and the source terminal is electrically coupled to the drain terminal of the pull-up transistor Mu1. In the pull-up transistor Mu1, the gate terminal receives the pull-up selection signal Su outputted from the pull-up setting circuit LCu, and the source terminal is electrically coupled to the input/output node Nio. In the pull-down transistor Md2, the drain terminal is electrically coupled to the input/output node Nio, the gate terminal receives the core voltage Vcore, and the source terminal is electrically coupled to the drain terminal of the pull-down transistor Md1. In the pull-down transistor Md1, the gate terminal receives the pull-down selection signal Sd outputted from the pull-down setting circuit LCd, and the source terminal is electrically coupled to the ground voltage Gnd. In FIG. 3A, the gate terminals of the pull-up transistor Mu2 and the pull-down transistor Md2 of the post-driver 33*a* receive the core voltage Vcore regardless of the logic levels of the input signal IN and the enable signal EN. Therefore, the voltage of the input/output node Nio is determined based on the pull-up transistor Mu1 and the pull-down transistor Md1.

When the logic levels of the enable signal EN and the input signal IN change, the logic levels of the pull-up selection signal Su generated by the pull-up setting circuit LCu, the pull-down selection signal Sd generated by the pull-down setting circuit LCd, and the voltage level of the input/output pin IO set by the post-driver 33a and outputted in response to the pull-up selection signal Su and the pull-down selection signal Sd also change. Table 1 collects the logic levels of the signals inputted to or outputted from the input/output module of FIG. 3A. Since the voltage of the input/output node Nio is determined based on the ON/OFF states of the pull-up transistor Mu1 and the pull-down transistor Md1, the ON/OFF states of the pull-up transistor Mu2 and the pull-down transistor Md2 are not shown in Table 1.

TABLE 1

| Signals received from control circuit | | pull-up setting circuit LCu | | | pull-up circuit | pull-down setting circuit LCd | | | pull-down circuit | IO pin |
|---|---|---|---|---|---|---|---|---|---|---|
| EN | IN | INb | ENb | Su | Mu1 | INb | EN | Sd | Md1 | IO |
| 0 | 0 | 1 | 1 | 0 | OFF | 1 | 0 | 0 | OFF | Z |
|   | 1 | 0 |   |   |     | 0 |   |   |     |   |
| 1 | 0 | 1 | 0 | 0 | OFF | 1 | 1 | 1 | ON  | Gnd |
|   | 1 | 0 |   | 1 | ON  | 0 |   | 0 | OFF | Vdd |

Referring to Table 1 and FIG. 3A, when the enable signal EN is at the low logic level (EN=0), the inverted enable signal ENb is at the high logic level (ENb=1). At this time, the pull-up selection signal Su generated by the NOR gate serving as the pull-up setting circuit LCu remains the low logic level (Su=0) regardless of the logic level of the input signal IN so that the pull-up transistor Mu1 is switched off. Also, when the enable signal EN is at the low logic level (EN=0), the pull-down selection signal Sd generated by the AND gate serving as the pull-down setting circuit LCd remains at the low logic level (Sd=0) regardless of the logic level of the input signal IN so that the pull-down transistor Md1 is switched off. In other words, when the enable signal EN is at the low logic level (EN=0), the pull-up circuit 331a and the pull-down circuit 333a do not form conducting paths. Therefore, the input/output pin IO is set to be in a high-impedance state (IO=Z).

Referring to Table 1 and FIG. 3A, when the enable signal EN is at the high logic level (EN=1), the inverted enable signal ENb is at the low logic level (ENb=0). The logic level of the pull-up selection signal Su generated by the NOR gate serving as the pull-up setting circuit LCu depends on the logic level of the inverted input signal INb. Similarly, the logic level of the pull-down selection signal Sd generated by the AND gate serving as the pull-down setting circuit LCd depends on the logic level of the inverted input signal INb.

Please refer to Table 1 and FIG. 3A to consider the condition that the enable signal EN is at the high logic level (EN=1) and the input signal IN is at the low logic level (IN=0). At this time, the inverted input signal INb is at the high logic level (INb=1). About the pull-up setting circuit LCu, since the inverted input signal INb is at the high logic level (INb=1), the pull-up selection signal Su is at the low logic level (Su=0) so as to make the pull-up transistor Mu1 switched off. Therefore, the pull-up circuit 331a does not affect the voltage level of the input/output pin IO. On the other hand, about the pull-down setting circuit LCd, since the inverted input signal INb is at the high logic level (IN=1), the pull-down selection signal Sd is at the high logic level (Sd=1) so as to make the pull-down transistor Md1 switched on. Because the gate terminal of the pull-down transistor Md2 receives the core voltage Vcore, the pull-down transistor Md2 is switched on as the pull-down transistor Md1. At this time, the pull-down circuit 333a conducts the ground voltage Gnd to the input/output pin IO (IO=Gnd).

Please refer to Table 1 and FIG. 3A to consider the condition that the enable signal EN is at the high logic level (EN=1) and the input signal IN is at the high logic level (IN=1). At this time, the inverted input signal INb is at the low logic level (INb=0). With regard to the pull-up setting circuit LCu, when the inverted input signal INb is at the low logic level (INb=0), the pull-up selection signal Su is at the high logic level (Su=1) so as to make the pull-up transistor Mu1 switched on. Because the gate terminal of the pull-up transistor Mu2 receives the core voltage, the pull-up transistor Mu2 is switched on as the pull-up transistor Mu1. At this time, the pull-up circuit 331a conducts the supply voltage Vdd to the input/output pin IO (IO=Vdd). On the other hand, with regard to the pull-down setting circuit LCd, since the inverted input signal INb is at the low logic level (INb=0), the pull-down selection signal Sd is at the low logic level (Sd=0) so as to make the pull-down transistor Md1 switched off. Therefore, the pull-down circuit 333a does not affect the voltage level of the input/output pin IO.

Please refer to FIG. 3B, which is a circuit diagram illustrating an input/output module according to another embodiment of the present disclosure. The components and internal connection of the pre-driver 31b are described below.

In the pre-driver 31b, the enable circuit LCen is an inverter, the pull-up setting circuit LCu is an AND gate, and the pull-down setting circuit LCd is a NOR gate. At first, the enable circuit LCen inverts the enable signal EN to generate an inverted enable signal ENb. In FIG. 3B, after receiving the enable signal EN and generating the inverted enable signal ENb, the enable circuit LCen transmits the inverted enable signal ENb to the pull-down setting circuit LCd. Therefore, the enable circuit LCen in FIG. 3B is equivalent to the enable circuit LCen2 in FIG. 2. After receiving the input signal IN and the enable signal EN, the AND gate serving as the pull-up setting circuit LCu generates the pull-up selection signal Su. Also, after receiving the input signal IN and the inverted enable signal ENb, the NOR gate serving as the pull-down setting circuit LCd generates the pull-down selection signal Sd.

The post-driver 33b in FIG. 3B has a similar structure to the post-driver 33a in FIG. 3A, so related details could be derived from the above embodiment and are not given herein.

When the logic levels of the enable signal EN and the input signal IN change, the logic levels of the pull-up selection signal Su generated by the pull-up setting circuit LCu, the pull-down selection signal Sd generated by the pull-down setting circuit LCd, and the voltage level of the input/output pin IO set by the post-driver 33b and outputted in response to the pull-up selection signal Su and the pull-down selection signal Sd also change. Table 2 collects the logic levels of the signals inputted to or outputted from the input/output module of FIG. 3B. Since the voltage level of the input/output node Nio is determined based on the ON/OFF states of the pull-up transistor Mu1 and the pull-down transistor Md1, the ON/OFF states of the pull-up transistor Mu2 and the pull-down transistor Md2 are not shown in Table 2.

TABLE 2

| Signals received from control circuit | | pull-up setting circuit LCu | | | pull-up circuit | pull-down setting circuit LCd | | | pull-down circuit | IO pin |
|---|---|---|---|---|---|---|---|---|---|---|
| EN | IN | IN | EN | Su | Mu1 | IN | ENb | Sd | Md1 | IO |
| 0 | 0 | 0 | 0 | 0 | OFF | 0 | 1 | 0 | OFF | Z |
| 0 | 1 | 1 | 0 | 0 | OFF | 1 | 1 | 0 | OFF | Z |
| 1 | 0 | 0 | 1 | 0 | OFF | 0 | 0 | 1 | ON | Gnd |
| 1 | 1 | 1 | 1 | 1 | ON | 1 | 0 | 0 | OFF | Vdd |

Referring to Table 2 and FIG. 3B, when the enable signal EN is at the low logic level (EN=0), the pull-up selection signal Su generated by the AND gate serving as the pull-up setting circuit LCu remains the low logic level (Su=0) regardless of the logic level of the input signal IN so that the pull-up transistor Mu1 is switched off. Also, when the enable signal EN is at the low logic level (EN=0), the inverted enable signal ENb is at the high logic level (ENb=1) and the pull-down selection signal Sd generated by the NOR gate serving as the pull-down setting circuit LCd remains at the low logic level (Sd=0) so that the pull-down transistor Md1 is switched off. In other words, when the enable signal EN is at the low logic level (EN=0), the pull-up circuit 331*b* and the pull-down circuit 333*b* do not form conducting paths. Therefore, the input/output pin IO is set to be in a high-impedance state (IO=Z).

Referring to Table 2 and FIG. 3B, when the enable signal EN is at the high logic level (EN=1), the inverted enable signal ENb is at the low logic level (ENb=0). The logic level of the pull-up selection signal Su generated by the AND gate serving as the pull-up setting circuit LCu depends on the logic level of the input signal IN. Similarly, the logic level of the pull-down selection signal Sd generated by the NOR gate serving as the pull-down setting circuit LCd depends on the logic level of the input signal IN.

Please refer to Table 2 and FIG. 3B to consider the condition that the enable signal EN is at the high logic level (EN=1) and the input signal IN is at the low logic level (IN=0). At this time, the pull-up selection signal Su outputted from the pull-up setting circuit LCu is at the low logic level (Su=0) so as to make the pull-up transistor Mu1 switched off. Therefore, the pull-up circuit 331*b* does not affect the voltage level of the input/output pin IO. On the other hand, since the input signal IN is at the low logic level (IN=0), the pull-down selection signal Sd is at the high logic level (Sd=1) so as to make the pull-down transistor Md1 switched on. Because the gate terminal of the pull-down transistor Md2 receives the core voltage Vcore, the pull-down transistor Md2 is switched on as the pull-down transistor Md1. At this time, the pull-down circuit 333*b* conducts the ground voltage Gnd to the input/output pin IO (IO=Gnd).

Please refer to Table 2 and FIG. 3B to consider the condition that the enable signal EN is at the high logic level (EN=1) and the input signal IN is at the high logic level (IN=1). At this time, the pull-up selection signal Su outputted from the pull-up setting circuit LCu is at the high logic level (Su=1) so as to make the pull-up transistor Mu1 switched on. Since the gate terminal of the pull-up transistor Mu2 receives the core voltage Vcore, the pull-up transistor Mu2 is switched on as the pull-up transistor Mu1. At this time, the pull-up circuit 331*b* conducts the supply voltage Vdd to the input/output pin IO (IO=Vdd). On the other hand, with regard to the pull-down setting circuit LCd, since the input signal IN is at the high logic level (IN=1), the pull-down selection signal Sd is at the low logic level (Sd=0) so as to make the pull-down transistor Md1 switched off. Therefore, the pull-down circuit 333*b* does not affect the voltage level of the input/output pin IO.

From the above description with reference to FIGS. 3A and 3B, when the enable signal EN is at the high logic level (EN=1), the voltage level of the input/output pin IO varies with the logic level of the input signal IN. When the input signal IN is at the low logic level (IN=0), the pull-down circuits 333*a* and 333*b* conduct the ground voltage Gnd to the input/output pin IO (IO=Gnd). Alternatively, when the input signal IN is at the high logic level (IN=1), the pull-up circuits 331*a* and 331*b* conduct the supply voltage Vdd to the input/output pin IO (IO=Vdd).

Figure 4:
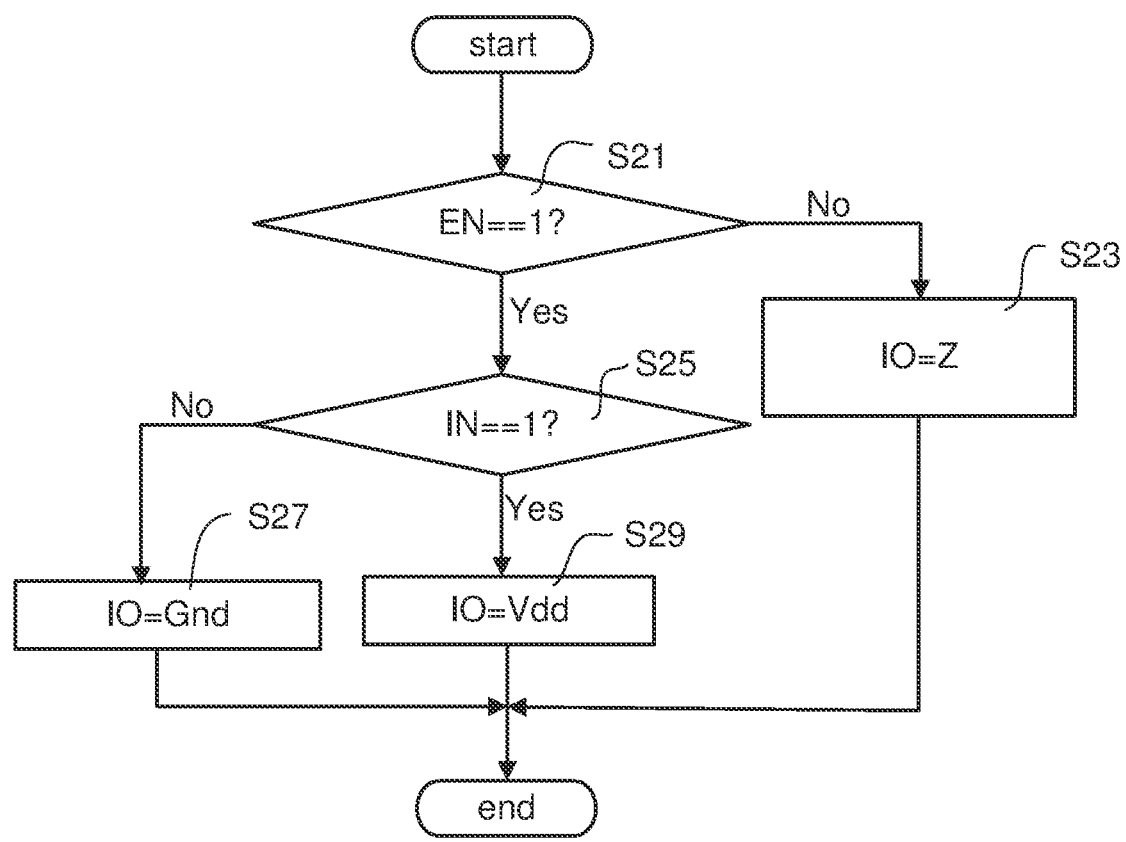
FIG. 4 is a flowchart illustrating the operation of the input/output module of the present disclosure.

Please refer to FIG. 4, which is a flowchart illustrating the operation of the input/output module of the present disclosure. At first, the method determines whether the logic level of the enable signal EN indicates an enable state or not (step S21). If the enable signal EN indicates a disable state, the input/output pin IO is set to be in a high-impedance state (IO=Z) (step S23). In the above embodiments, it has been defined that the high logic level of the enable signal EN (EN=1) indicates the enable state, and the low logic level of the enable signal EN (EN=0) indicates the disable state. In other applications, it may be defined that the low logic level of the enable signal EN (EN=0) indicates the enable state, and the high logic level of the enable signal EN (EN=1) indicates the disable state.

If the enable signal EN indicates the enable state, the logic level of the input signal IN is further considered. If the input signal IN is at the high logic level (IN=1), the voltage level of the input/output pin IO is set to the supply voltage Vdd (IO=Vdd) (step S29). Otherwise, if the input signal IN is at the low logic level (IN=0), the voltage level of the input/output pin IO is set to the ground voltage Gnd (IO=Gnd) (step S27). In other applications, it is also applicable that if the input signal IN is at the high logic level (IN=1), the voltage level of the input/output pin IO is set to the ground voltage Gnd (IO=Gnd); and otherwise, if the input signal IN is at the low logic level (IN=0), the voltage level of the input/output pin IO is set to the supply voltage Vdd (IO=Vdd).

According to the concepts of the present disclosure, the components of the pull-up circuit 231 and the pull-down circuit 233 could be modified. In FIGS. 3A and 3B, the post-driver 33*a*, 33*b* includes the pull-up transistors Mu1 and Mu2 and the pull-down transistors Md1 and Md2. In FIGS. 5A and 5B, the post-driver includes the pull-up transistor Mu1 and the pull-down transistors Md1 and Md2. In FIGS. 6A and 6B, the post-driver includes the pull-up transistors Mu1 and Mu2 and the pull-down transistor Md1. Specifically, the gate terminal of the pull-up transistor Mu1 receives the pull-up selection signal Su, the gate terminal of the pull-down transistor Md1 receives the pull-down selection signal Sd; and the gate terminals of the pull-up transistor Mu2 and the pull-down transistor Md2 receive the core voltage Vcore.

Please refer to FIGS. 5A and 5B, which are circuit diagrams illustrating input/output modules using a modified pull-up circuit according to the present disclosure. The pre-driver in FIG. 5A has the structure of the pre-driver 31*a* as shown in FIG. 3A. The difference is that the pull-up circuit 331*a* in FIG. 3A includes the pull-up transistors Mu1 and Mu2, but the pull-up circuit in FIG. 5A includes only one pull-up transistor Mu1. Also, the pre-driver in FIG. 5B has the structure of the pre-driver 31*a* as shown in FIG. 3B.

The difference is that the pull-up circuit 331b in FIG. 3B includes the pull-up transistors Mu1 and Mu2, but the pull-up circuit in FIG. 5B includes only one pull-up transistor Mu1.

As described above, the pull-up transistor Mu1 is the decisive factor of whether the pull-up circuit 331a conducts the supply voltage Vdd to the input/output node Nio or not. Therefore, although the pull-up circuits in FIGS. 5A and 5B do not include the pull-up transistor Mu2 receiving the core voltage Vcore, the operation of the input/output modules in FIGS. 5A and 5B are similar to that in FIGS. 3A and 3B, and could be derived from the above description.

Please refer to FIGS. 6A and 6B, which are circuit diagrams illustrating input/output modules using another modified pull-down circuit according to the present disclosure. The pre-driver in FIG. 6A has the structure of the pre-driver 31a as shown in FIG. 3A. The difference is that the pull-down circuit 333a in FIG. 3A includes the pull-down transistors Md1 and Md2, but the pull-down circuit in FIG. 6A includes only one pull-down transistor Md1. Also, the pre-driver in FIG. 6B has the structure of the pre-driver 31b as shown in FIG. 3B. The difference is that the pull-down circuit 333b in FIG. 3B includes the pull-down transistors Md1 and Md2, but the pull-down circuit in FIG. 6B includes only one pull-down transistor Md1.

As described above, the pull-down transistor Md1 is the decisive factor of whether the pull-down circuit 333b conducts the ground voltage Gnd to the input/output node Nio or not. Therefore, although the pull-down circuits in FIGS. 6A and 6B do not include the pull-down transistor Md2 receiving the core voltage Vcore, the operation of the input/output modules in FIGS. 6A and 6B are similar to that in FIGS. 3A and 3B, and could be derived from the above description.

In the above embodiments, it is given that when the enable signal EN is at the low logic level (EN=0), the input/output node Nio has a high impedance (IO=Z); and when the enable signal EN is at the high logic level (EN=1), the voltage of the input/output node Nio is determined according to the logic level of the input signal IN. The applications could be modified to provide that when the enable signal EN is at the high logic level (EN=1), the input/output node Nio has a high impedance (IO=Z); and when the enable signal EN is at the low logic level (EN=0), the voltage of the input/output node Nio is determined according to the logic level of the input signal IN.

In the embodiments with reference to FIGS. 3A, 5A, and 6A, the input circuit LCin is an inverter. The inverter generates the inverted input signal INb, and then transmits the inverted input signal INb to the pull-up setting circuit LCu and the pull-down setting circuit LCd. The inverted input signal INb is the input of the pull-up setting circuit LCu and pull-down setting circuit LCd. In the embodiments with reference to FIGS. 3B, 5B, and 6B, the pre-driver does not include the input circuit LCin, and receives the input signal IN from the control circuit 26 directly.

Figure 1:
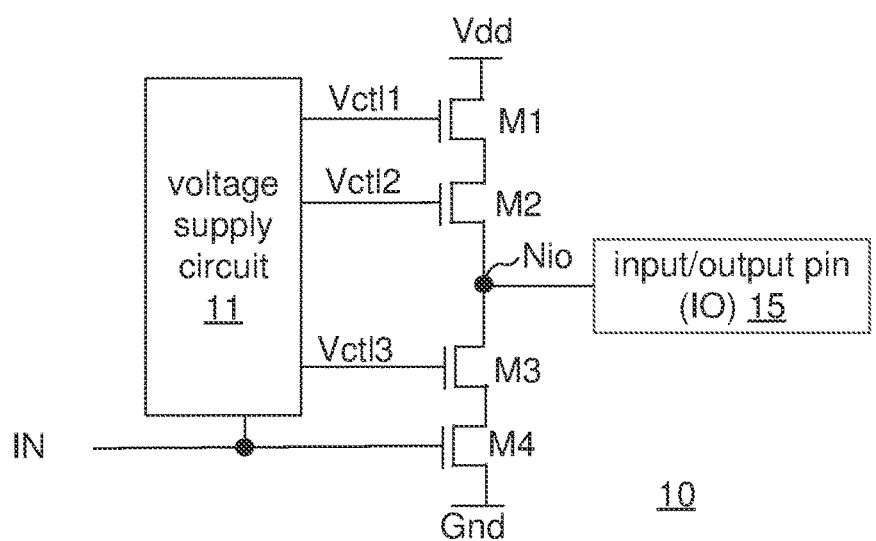
FIG. 1 (prior art) is a schematic diagram illustrating a conventional input/output module.

Compared with the prior arts, the input/output module of the present disclosure receives the input signal IN and the enable signal EN from the control circuit 26. The input signal IN, the enable signal EN, and both the pull-up selection signal Su and the pull-down selection signal Sd generated by the pre-driver are logic signals. These logic signals at a high logic level are equivalent to the core voltage Vcore (for example, 0.8V), and these logic signals at a low logic level have a voltage of 0V. The voltage that the input/output module 20 provides to the input/output pin IO has only two voltage values because the control circuit 26 uses logic levels to control the input/output module 20. The switching among the logic levels is more convenient, and the complexity of setting the duty cycle of the input/output pin IO is reduced as well. Furthermore, unlike the voltage supply circuit in FIG. 1 that needs an extra level shifter to generate the different control voltages Vctl1, Vctl2, Vctl3, the core voltage Vcore being received by the post-driver from the control circuit can be utilized to bias the transistor(s) in the post-driver. Therefore, the design of the input/output module 20 according to the present disclosure is relatively simple and low cost.

Please note that, although it is assumed that the pull-up circuit and the pull-down circuit in the embodiments above adopt the NMOS transistors, the transistors included in the pull-up circuit and the pull-down circuit in the practical application can be different. For example, the pull-up circuit may adopt the PMOS transistor, and the pull-down circuit may adopt the NMOS transistor. When both the pull-up circuit and the pull-down circuit adopt the NMOS transistors, the swing of the input/output pin IO is smaller, and the input/output module consumes less power.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An input/output module electrically coupled between a control circuit and an input/output pin, the input/output module comprising:
    a pre-driver, electrically coupled to the control circuit, for generating a pull-up selection signal and a pull-down selection signal according to logic levels of an input signal and an enable signal generated by the control circuit; and
    a post-driver, electrically coupled between the pre-driver and the input/output pin, for changing a voltage level of the input/output pin according to the pull-up selection signal and the pull-down selection signal, wherein the post-driver comprises:
        a pull-up circuit, electrically coupled to the pre-driver, for selectively conducting a supply voltage to the input/output pin in response to the pull-up selection signal;
        a pull-up resistor, electrically coupled between the pull-up circuit and the input/output pin;
        a pull-down circuit, electrically coupled to the pre-driver, for selectively conducting a ground voltage to the input/output pin in response to the pull-down selection signal; and
        a pull-down resistor, electrically coupled between the pull-down circuit and the input/output pin,
    wherein at least one of the pull-up circuit and the pull-down circuit receives a core voltage from the control circuit, wherein
    when the enable signal is at a first logic level, the post-driver sets the input/output pin to be in a high-impedance state, and
    when the enable signal is at a second logic level, the post-driver changes the voltage level of the input/output pin according to the logic level of the input signal, wherein the first logic level and the second logic level are inverted, and the pull-up selection signal, the pull-down selection signal, and the core voltage are lower than the supply voltage.

2. The input/output module according to claim 1, wherein:

when the enable signal is at the second logic level and the input signal is at the first logic level, the input/output pin has a first voltage level; and when the enable signal is at the second logic level and the input signal is at the second logic level, the input/output pin has a second voltage level.

3. The input/output module according to claim 1, wherein:

when the enable signal is at the first logic level, the pull-up circuit disconnects the input/output pin from the supply voltage according to the pull-up selection signal, and the pull-down circuit disconnects the input/output pin from the ground voltage according to the pull-down selection signal; and when the enable signal is at the second logic level, the pull-up circuit conducts the supply voltage to the input/output pin according to the pull-up selection signal, or the pull-down circuit conducts the ground voltage to the input/output pin according to the pull-down selection signal.

4. The input/output module according to claim 1, wherein the pull-up circuit comprises:

a first pull-up transistor, electrically coupled between the pre-driver and the input/output pin, for receiving the pull-up selection signal from the pre-driver, wherein the first pull-up transistor is selectively switched on according to a logic level of the pull-up selection signal.

5. The input/output module according to claim 4, wherein the pull-up circuit further comprises:

a second pull-up transistor, electrically coupled to the control circuit, the first pull-up transistor, and the supply voltage, for receiving the core voltage from the control circuit.

6. The input/output module according to claim 1, wherein the pull-down circuit comprises:

a first pull-down transistor, electrically coupled between the pre-driver and the ground voltage, for receiving the pull-down selection signal from the pre-driver, wherein the first pull-down transistor is selectively switched on according to a logic level of the pull-down selection signal.

7. The input/output module according to claim 6, wherein the pull-down circuit further comprises:

a second pull-down transistor, electrically coupled to the control circuit, the first pull-down transistor, and the input/output pin, for receiving the core voltage from the control circuit.

8. The input/output module according to claim 1, wherein the pre-driver comprises:

a pull-up setting circuit, electrically coupled to the pull-up circuit, for generating the pull-up selection signal according to the input signal and the enable signal; and a pull-down setting circuit, electrically coupled to the pull-down circuit, for generating the pull-down selection signal according to the input signal and the enable signal.

9. The input/output module according to claim 8, wherein the pull-up setting circuit and the pull-down setting circuit receive the input signal from the control circuit directly.

10. The input/output module according to claim 8, wherein the pre-driver further comprises:

an input circuit, electrically coupled to the control circuit, the pull-up setting circuit, and the pull-down setting circuit, for receiving the input signal from the control circuit and generating an inverted input signal, wherein the pull-up setting circuit and the pull-down setting circuit receive the inverted input signal from the input circuit.

11. The input/output module according to claim 8, wherein the pre-driver further comprises:

an enable circuit, electrically coupled to the control circuit, for inverting the enable signal outputted from the control circuit to generate an inverted enable signal.

12. The input/output module according to claim 11, wherein:

the pull-up setting circuit generates the pull-up selection signal according to the input signal and the enable signal; or the pull-up setting circuit generates the pull-up selection signal according to an inverted input signal and the inverted enable signal.

13. The input/output module according to claim 11, wherein:

the pull-down setting circuit generates the pull-down selection signal according to the input signal and the inverted enable signal; or the pull-down setting circuit generates the pull-down selection signal according to an inverted input signal and the enable signal.

* * * * *